United States Patent
Wang et al.

(10) Patent No.: US 7,667,247 B2
(45) Date of Patent: Feb. 23, 2010

(54) METHOD FOR PASSIVATING GATE DIELECTRIC FILMS

(75) Inventors: Ching-Ya Wang, Taipei (TW); Wen-Chin Lee, Hsinchu (TW); Denny Tang, Saratoga, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 176 days.

(21) Appl. No.: 11/745,862

(22) Filed: May 8, 2007

(65) Prior Publication Data

US 2008/0242071 A1   Oct. 2, 2008

Related U.S. Application Data

(60) Provisional application No. 60/909,155, filed on Mar. 30, 2007.

(51) Int. Cl.
*H01L 29/80* (2006.01)
*H01L 31/112* (2006.01)

(52) U.S. Cl. .................. 257/287; 257/288; 257/289

(58) Field of Classification Search .......... 438/287, 438/288, 289, 290
See application file for complete search history.

(56) References Cited

U.S. PATENT DOCUMENTS

| | | | | |
|---|---|---|---|---|
| 5,814,149 A | * | 9/1998 | Shintani et al. | 117/104 |
| 6,984,565 B2 | * | 1/2006 | Kawahara | 438/287 |
| 7,242,055 B2 | * | 7/2007 | Bojarczuk et al. | 257/324 |
| 7,271,103 B2 | * | 9/2007 | Huang et al. | 438/706 |
| 7,387,973 B2 | * | 6/2008 | Wang et al. | 438/778 |
| 2004/0129200 A1 | | 7/2004 | Kouvetakis et al. | |
| 2004/0261689 A1 | | 12/2004 | Tsong et al. | |
| 2005/0236679 A1 | * | 10/2005 | Hori et al. | 257/411 |
| 2006/0160372 A1 | | 7/2006 | Dorfman | |
| 2006/0172474 A1 | * | 8/2006 | Wajda et al. | 438/151 |
| 2008/0096394 A1 | * | 4/2008 | Chen et al. | 438/758 |

* cited by examiner

*Primary Examiner*—Phuc T Dang
(74) *Attorney, Agent, or Firm*—Haynes and Boone, LLP (57) ABSTRACT

The present disclosure provides a method of fabricating a semiconductor device. The method includes providing a semiconductor substrate, forming a dielectric layer over the semiconductor substrate, treating the dielectric layer with a carbon containing group, forming a conductive layer over the treated dielectric layer, and patterning and etching the dielectric layer and conductive layer to form a gate structure. The carbon containing group includes an $OCH_3$ or CN species.

20 Claims, 5 Drawing Sheets

METHOD FOR PASSIVATING GATE DIELECTRIC FILMS

PRIORITY DATA

This application claims the priority under 35 U.S.C. §119 of U.S. Provisional Application Ser. No. 60/909,155 entitled "METHOD AND DEVICE FOR PASSIVATING GATE DIELECTRIC FILMS," filed Mar. 30, 2007.

BACKGROUND

The present disclosure relates generally to semiconductor devices and methods of manufacturing semiconductor devices, and more particularly to methods and devices for passivating gate dielectric films.

The semiconductor integrated circuit (IC) industry has experienced rapid growth. Technological advances in IC materials and designs have produced generations of ICs where each generation has smaller and more complex circuits than the previous generation. In the course of these advances, functional density has generally increased while geometry size has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for a gate electrode and gate dielectric for MOS or CMOS devices. More specifically, high-k dielectric films have been employed for the gate dielectric to achieve the required equivalent oxide thickness (EOT) while keeping the leakage current of the device to a minimum. However, using high-K dielectric films for the gate dielectric may adversely affect a threshold voltage due to Fermi-level pinning phenomenon at the gate dielectric/electrode interface and thus, may lead to poor device performance and reliability.

Therefore, what is needed is a simple and cost-effective method and device for passivating a gate dielectric film in semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
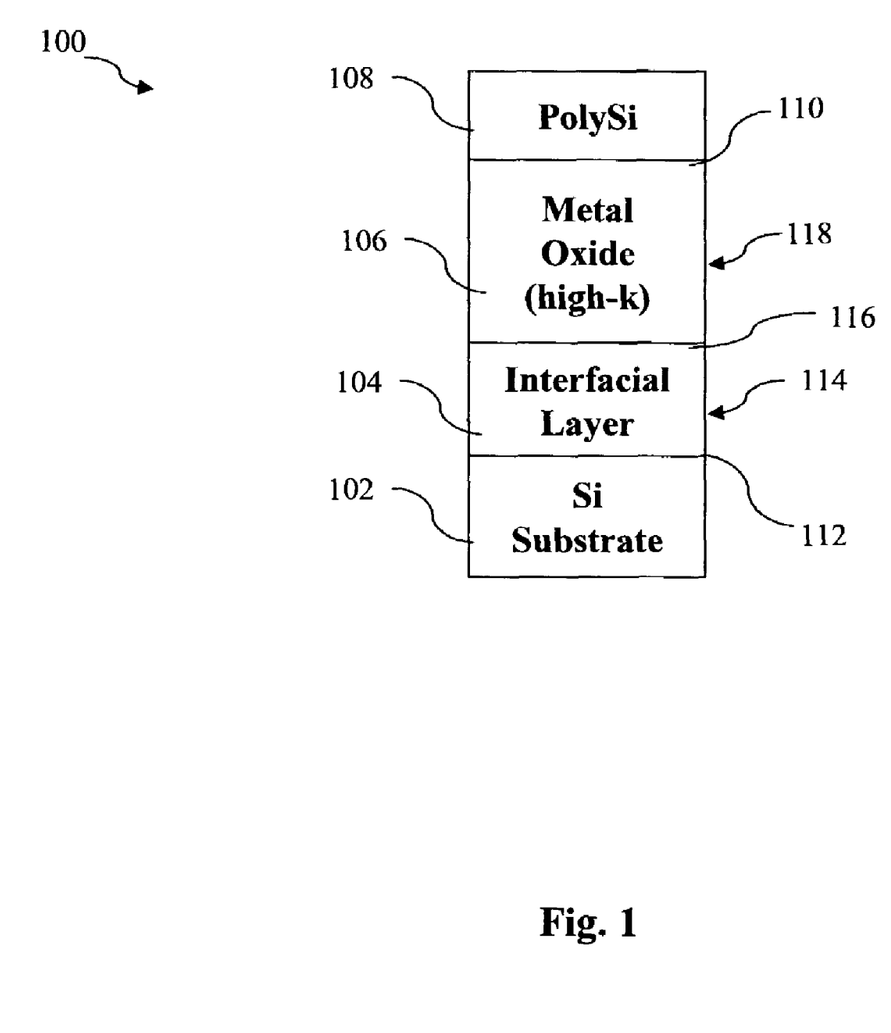
FIG. 1 is a cross-sectional view of part of semiconductor device having a conventional gate structure.

Referring now to FIG. 1, illustrated is a cross-sectional view of part a semiconductor device 100 having a conventional gate structure. The semiconductor device 100 may comprise a substrate 102, an interfacial layer 104 formed directly on the substrate, a dielectric layer 106 formed on the interfacial layer, and a conductive layer 108 formed on the dielectric layer. In the present example, the substrate 102 may include silicon (Si). Alternatively, the substrate 102 may include other suitable semiconductor materials, such as germanium (Ge), silicon germanium (SiGe), and gallium arsenide (GaAs). The substrate 102 may include other suitable elementary semiconductor materials, such as diamond. The substrate 102 may further include other suitable compound semiconductor materials, such as silicon carbide (SiC), indium arsenide (InAs), and indium phosphide (InP). The substrate 102 may also include other suitable alloy semiconductor materials, such as silicon-germanium carbide (SiGeC), gallium arsenide phosphide (GaAsP), and indium gallium phosphide (InGaP). In other embodiments, the substrate 102 may include a semiconductor-on-insulator such as silicon-on-insulator (SOI). In some other embodiments, the substrate 102 may include a gradient semiconductor layer, and/or may further include a semiconductor layer overlying another semiconductor layer of a different type such as a silicon layer on a silicon germanium layer. The substrate 102 may further include various features such as doped regions, buried layer, and/or an epitaxy layer (not shown).

The interfacial layer 104 may include a silicon oxide. The interfacial layer 104 may be formed by rapid thermal oxidation (RTO). Alternatively, the interfacial layer 104 may optionally include silicon oxynitride (SiON). The interfacial layer 104 may be configured to prevent chemical reactions between adjacent layers, such as the substrate 102 and dielectric layer 106.

The dielectric layer 106 may be formed on the interfacial layer 104 by various techniques, such as atomic layer deposition (ALD), chemical vapor deposition (CVD), physical vapor deposition (PVD), metal-organic chemical deposition (MOCVD), and other suitable techniques. The dielectric layer 106 may include a high-k dielectric film, such as a metal oxide having a dielectric constant (k) greater than or equal to about 3.9. More specifically, examples of high-k dielectric films include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium titanium tantalum oxide (HfTiTaO), hafnium aluminum iodine oxynitride (HfAlON), and hafnium zirconium oxide (HfZrO). Alternatively, the dielectric layer 106 may optionally include a multilayer structure.

For example, the dielectric layer 106 may include a dielectric stack with a layer of silicon oxide and a layer of high-k dielectric film.

The conductive layer 108 may include polysilicon formed on the dielectric layer 106 by various techniques such as low pressure chemical vapor deposition (LPCVD). The polysilicon may further be doped with negative type (N-type) dopants or positive type (P-type) dopants. Alternatively, the conductive layer 108 may include a metal, such as Al, Ni, Ru, W, Pd, TaC, Yb, La, Hf, Ti, and other suitable conductive material. The process to form a gate electrode from the conductive layer 108 may include a patterning and etching step.

The semiconductor device 100 may include other various features, such as gate spacers that may be formed on both sides of gate structure formed by a deposition and etching step. The gate spacers may include a suitable dielectric material such as silicon nitride, silicon oxide, silicon carbide, silicon oxynitride, or combinations thereof. Additionally, source and drain regions may be formed in the substrate 102 using ion implantation or diffusion.

It is understood that the semiconductor device 100 is not limited to a specific transistor and may include negative metal-oxide-semiconductor transistor (NMOS), positive metal-oxide-semiconductor transistor (PMOS), complementary metal-oxide-semiconductor transistor (CMOS), a MOSFET transistor, or combinations thereof. The semiconductor device may further include a bipolar transistor, capacitor, resistor, diode, or combinations thereof.

As previously noted, using high-k dielectric films for the gate dielectric may cause a threshold voltage to drift due to Fermi-level pinning at a polysilicon/metal oxide interface 110. Furthermore, other possible regions that may contribute to the drift include a silicon substrate/interfacial layer interface 112, a bulk interfacial layer charge 114, a metal oxide/interfacial layer interface 116, and a bulk metal oxide charge 118. Additionally, the interfacial layer 104 may cause an increase in an equivalent oxide thickness (EOT) of the gate stack. As a result, the semiconductor device 100 may suffer from poor device performance and reliability. Therefore, what is need is a cost-effective method and semiconductor device for passivating the high-k dielectric film without utilizing an interfacial layer.

Figure 2:
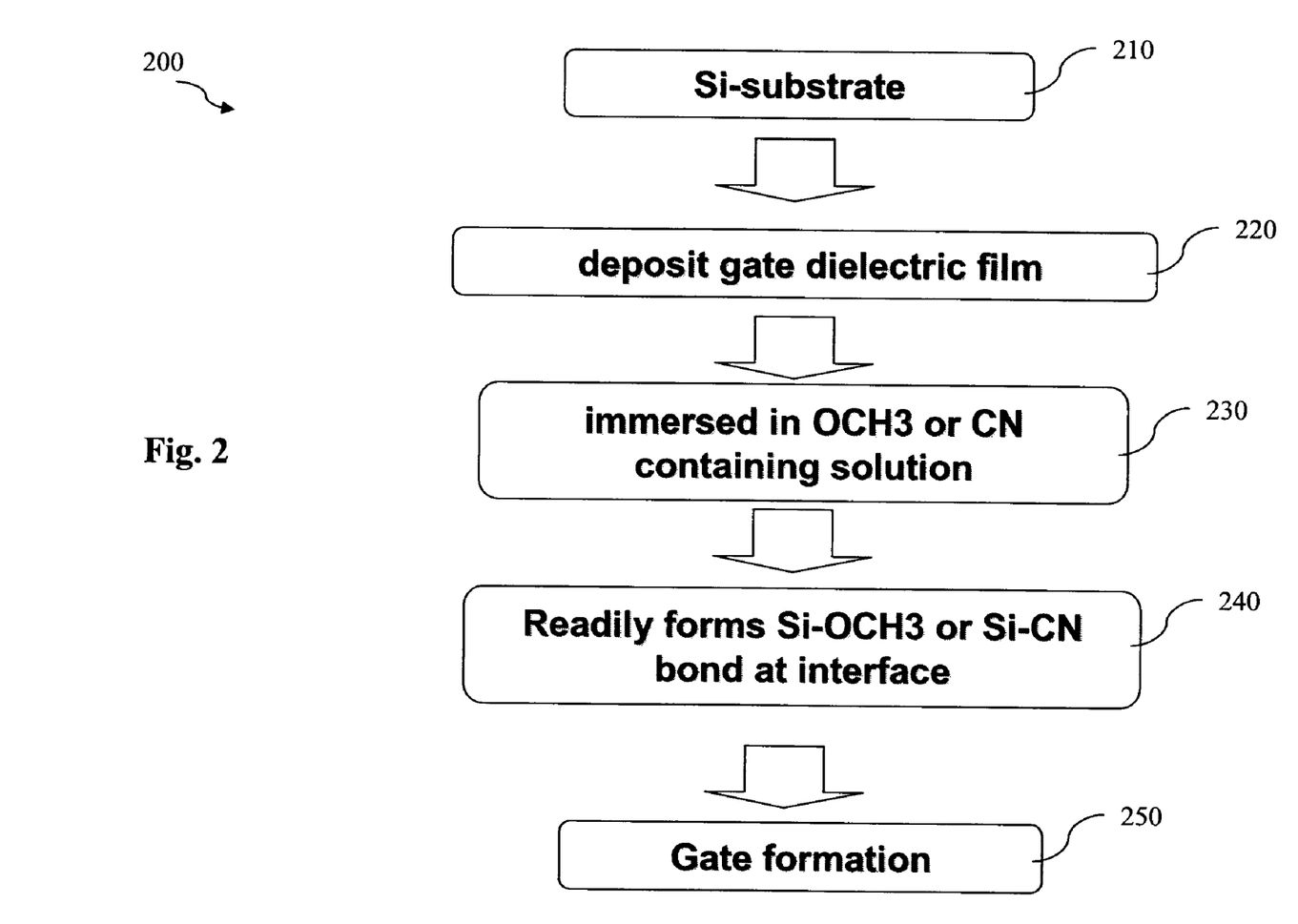
FIG. 2 is a flow chart illustrating one embodiment of a method for passivating a gate dielectric of a semiconductor device.

Referring to FIG. 2, illustrated is one embodiment of a method 200 for fabricating a gate structure of a semiconductor device. The method 200 begins with step 210 in which a semiconductor substrate such as a silicon substrate (Si-substrate) may be provided. The semiconductor substrate may be similar to the one discussed in FIG. 1. The method 200 continues with step 220 in which a gate dielectric layer may be formed on the silicon substrate by a deposition process. The gate dielectric layer may include a high-k dielectric film similar to the one discussed in FIG. 1. Additionally, the gate dielectric layer may include silicon oxide. The silicon oxide may be formed using a process such as thermal oxidation. The high-k dielectric film may have a dielectric constant greater than or equal to about 3.9.

The method 200 continues with step 230 in which the gate dielectric layer may be treated with a carbon containing group. The carbon containing group may include an $OCH_3$ or CN species. For example, the gate dielectric layer on the silicon substrate may be immersed in a solution containing the $OCH_3$ or CN species. The time period for the treatment may vary depending on a particular recipe. The $OCH_3$ species may include R—$OCH_3$, where R equals $C_xH_y$, where x,y equals an integer: 1, 2, 3, 4, etc. The CN species may include a KCN, HCN, or other suitable solution.

The method 200 continues with step 240 in which a gate conductor layer of polysilicon may be formed on the treated gate dielectric layer. Alternatively, the gate conductor layer may optionally include a metal as was discussed in FIG. 1. The $OCH_3$ or CN species may readily react with the silicon forming Si—$OCH_3$ or Si—CN bonds at the interface (e.g., the dangling bonds at the surface may be terminated by the $OCH_3$ or CN bond). The $OCH_3$ or CN bonds at the interface may be detected. It has been observed that Si—$OCH_3$ and Si—CN bonds (approximately 96 kcal/mol and 153 kcal/mol, respectively) have a higher bond energy than Si—H bonds. Accordingly, the interface between the gate dielectric layer and the gate conductor layer may be passivated and stabilized. It is understood that other types of $OCH_3$ or CN bonds, such as Hf—$OCH_3$ or Hf—CN, may be formed depending on the type of high-k dielectric film that is utilized.

The method 200 continues with step 250 in which a gate structure may be formed from the gate dielectric layer and gate conductor layer by a patterning and etching step. Due to the passivation of the gate dielectric layer with the treatment step 230, drifting of a threshold voltage of the semiconductor device may be reduced and thus, better device performance and reliability may be achieved.

Figure 3:
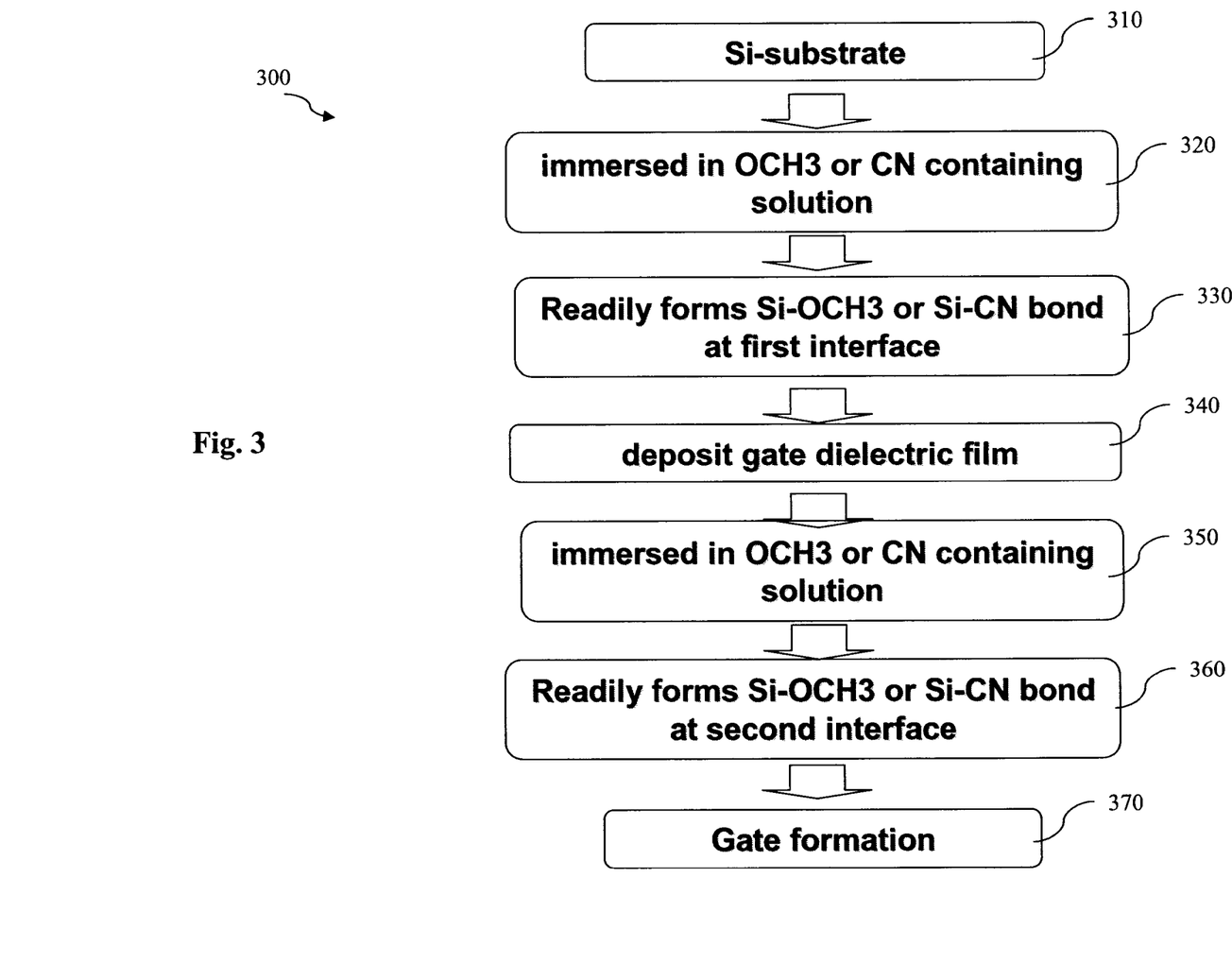
FIG. 3 is a flow chart illustrating another embodiment of a method for passivating a gate dielectric of a semiconductor device.

Now referring to FIG. 3, illustrated is another embodiment of a method 300 for fabricating a gate structure of a semiconductor device. The method 300 of FIG. 3 is similar to the method 200 of FIG. 2. The method 300 begins with step 310 in which a semiconductor substrate such as a silicon substrate (Si-substrate) may be provided. The semiconductor substrate may be similar to the one discussed in FIG. 1. The method 300 continues with step 320 in which the silicon substrate may be treated with a carbon containing group. The carbon containing group may include an $OCH_3$ or CN group. For example, the silicon substrate may be immersed in a solution containing the $OCH_3$ or CN group. The time period for the treatment may vary depending on a particular recipe. The $OCH_3$ group may include R—$OCH_3$, where R equals $C_xH_y$, where x,y equals an integer: 1, 2, 3, 4, etc. The CN group may include a KCN or HCN solution. The method 300 continues with step 330 in which the $OCH_3$ or CN may readily react with the silicon substrate forming Si—$OCH_3$ or Si—CN bonds at a first interface (e.g., the dangling bonds at the surface may be terminated by the $OCH_3$ or CN bond). The $OCH_3$ or CN bonds at the first interface may be detected. It has been observed that Si—$OCH_3$ and Si—CN bonds have a high bond energy at approximately 96 kcal/mol and 153 kcal/mol, respectively.

The method 300 continues with step 340 in which a gate dielectric layer may be formed on the treated silicon substrate by a deposition process. The gate dielectric layer may include a high-k dielectric film similar to the one discussed in FIG. 1. Additionally, the gate dielectric layer may include silicon oxide. The silicon oxide may be formed using a technique such as thermal oxidation. The high-k dielectric film may have a dielectric constant greater than or equal to about 3.9. Due to the treatment step 320, the second interface between the silicon substrate and the gate dielectric layer may be passivated and stabilized.

The method 300 continues with step 350 in which the gate dielectric layer may also be treated with the carbon containing group as was discussed in step 320. The method 300 continues with step 360 in which a gate conductor layer of polysilicon may be formed on the treated gate dielectric layer. The $OCH_3$ or CN may readily react with the silicon forming Si—$OCH_3$ or Si—CN bonds at a second interface (e.g., the dangling bonds at the surface may be terminated by the $OCH_3$ or CN bond). The $OCH_3$ or CN bonds at the second interface may be detected. It has been observed that Si—OCH$_3$ and Si—CN bonds have a greater bond energy than Si—H. Accordingly, the second interface between the gate dielectric layer and gate conductor layer may be passivated and stabilized. It is understood that other types of OCH$_3$ or CN bonds, such as Hf—OCH$_3$ or Hf—CN, may be formed depending on the type of high-k dielectric film that is utilized.

The method 300 continues with step 370 in which a gate structure may be formed from the gate dielectric layer and the gate conductor layer by a patterning and etching step. Due to the passivation of the gate dielectric layer with the treatment steps 320 and 350, drifting of a threshold voltage of the semiconductor device may be reduced and thus, better device performance and reliability may be achieved.

Figure 4:
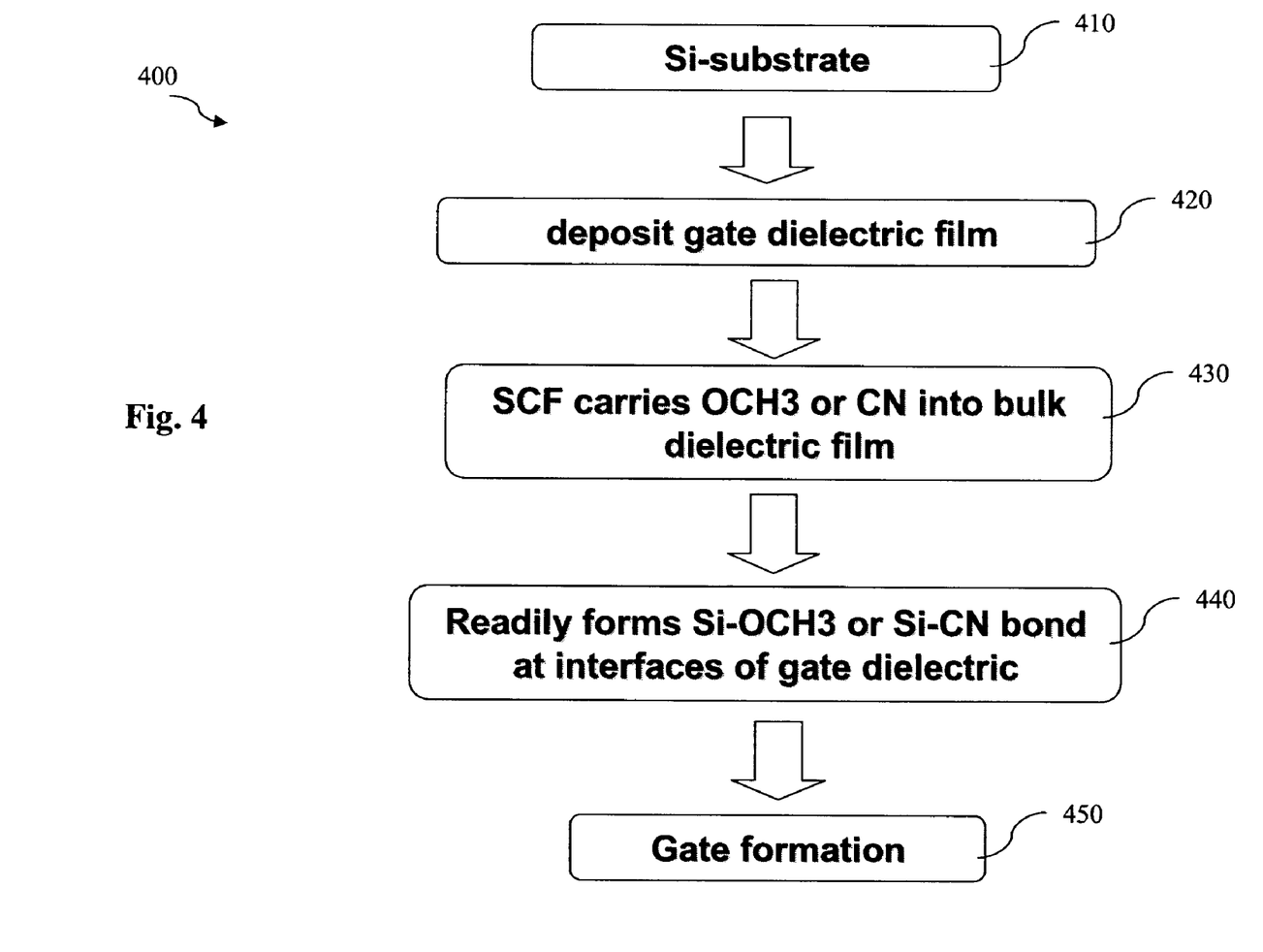
FIG. 4 is a flow chart illustrating still another embodiment of a method for passivating a gate dielectric of a semiconductor device.

Referring to FIG. 4, illustrated is a flow chart of another embodiment of a method 400 for fabricating a gate electrode of a semiconductor device. The method 400 of FIG. 4 may be similar to the method 200 of FIG. 2. The method 400 begins with step 410 in which a semiconductor substrate such as a silicon substrate (Si-substrate) may be provided. The semiconductor substrate may be similar to the one discussed in FIG. 1. The method 400 continues with step 420 in which a gate dielectric layer may be formed on the silicon substrate by a deposition technique. The gate dielectric layer may include a high-k dielectric film similar to the one discussed in FIG. 1. Additionally, the gate dielectric layer may include silicon oxide. The silicon oxide may be formed using a technique such as thermal oxidation. The high-k dielectric film may have a dielectric constant greater than or equal to about 3.9.

The method 400 continues with step 430 in which the gate dielectric layer may be treated with a supercritical fluid (SCF) carrying a carbon containing group. The supercritical fluid may have favorable properties that allow it to carry the carbon containing group into the bulk film of the gate dielectric layer and passivate it. For example, the supercritical fluid may have low surface tension, good diffusivity, and good solubility. The supercritical fluid may include various types, such as N$_2$, Ar, Xe, CO$_2$, propane, ammonia, isopropanol, methanol, and water. It is understood that for a particular type of supercritical fluid a temperature and pressure are required to achieve the supercritical state. For example, supercritical CO$_2$ (SCCO$_2$) may have a required temperature of about 31 degree C. (or greater) and a pressure of about 1072 psi (or greater). Accordingly, SCCO$_2$ is preferred since the required temperature and pressure are compatible with current semiconductor fabrication techniques and equipment. The carbon containing group may include an OCH$_3$ or CN species. The time period for the treatment may vary depending on a particular recipe. The OCH$_3$ species may include R—OCH$_3$, where R equals C$_x$H$_y$, where x,y equals an integer: 1, 2, 3, 4, etc. The CN species may include a KCN, HCN, or other suitable solution.

The method 400 continues with step 440 in which a gate conductor layer of polysilicon may be formed on the treated gate dielectric layer. Alternatively, the gate conductor layer may optionally include a metal as was discussed in FIG. 1. The OCH$_3$ or CN may readily react with the silicon forming Si—OCH$_3$ or Si—CN bonds at the interfaces of the gate dielectric layer (e.g., the dangling bonds at the surface may be terminated by the OCH$_3$ or CN bond). The OCH$_3$ or CN bonds at the interfaces may be detected. It has been observed that Si—OCH$_3$ and Si—CN bonds (approximately 96 kcal/mol and 153 kcal/mol, respectively) have a higher bond energy than Si—H bonds. Accordingly, the interface between the gate dielectric layer and the gate conductor layer and the interface between the silicon substrate and the gate dielectric layer may be passivated and stabilized. It is understood that other types of OCH$_3$ or CN bonds, such as Hf—OCH$_3$ or Hf—CN, may be formed depending on the type of high-k dielectric film that is utilized.

The method 400 continues with step 450 in which a gate structure may be formed from the gate dielectric layer and gate conductor layer by a patterning and etching step. Due to the passivation of the gate dielectric layer with the treatment step 430, drifting of a threshold voltage of the semiconductor device may be reduced and thus, better device performance and reliability may be achieved.

Figure 5:
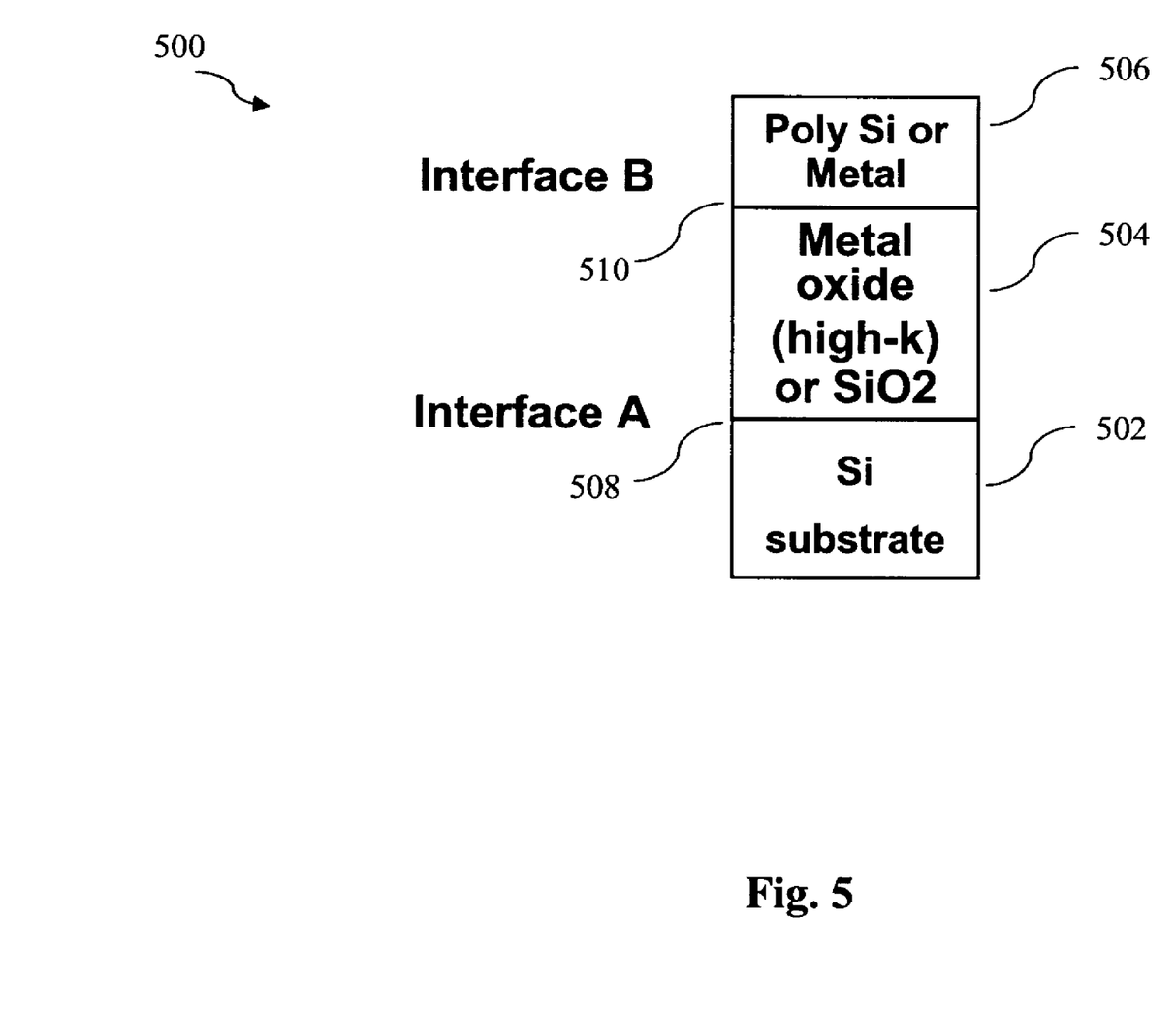
FIG. 5 is a cross-sectional view of a gate structure that has been formed according to the methods of FIGS. 2-4.

Referring to FIG. 5, illustrated is a cross-sectional view of a gate structure of a semiconductor device 500 fabricated by the methods discussed in FIGS. 2-4. The semiconductor device 500 may comprise a substrate 502 such as a silicon substrate (Si-substrate). Alternatively, the substrate 502 may include other types as was discussed in FIG. 1. The semiconductor device may comprise a dielectric layer 504 formed on the substrate 502. The dielectric layer 504 may include a high-k dielectric film such as a metal oxide or silicon oxide. The dielectric layer 504 may be configured to have a dielectric constant (k) greater than or equal to about 3.9. The semiconductor device 500 may further comprise a conductive layer 506 formed on the dielectric layer 504. The conductive layer 506 may include a polysilicon or metal as was discussed in FIG. 1. The gate structure may be formed from the dielectric layer 504 and the conductive layer 506 by a patterning and etching step.

It is noted that the gate structure of the semiconductor device 500 does not include an interfacial layer to prevent chemical reactions of adjacent layers. This is due to the passivation and stabilization of the dielectric layer 504 during the treatment step with the carbon containing group discussed in FIGS. 2-4. Accordingly, Si—OCH$_3$ or Si—CN (or other X—OCH$_3$ or X—CN) bonds form at an interface A 508 between the substrate 502 and the dielectric layer 504 and at an interface B 510 between the dielectric layer 504 and the conductive layer 506. The thickness at the interfaces may almost not be measurable since only the dangling bonds of the surface are terminated by the OCH$_3$ or CN bonds. As a result, drifting of a threshold voltage of the semiconductor device 500 may be reduced. Additionally, an equivalent oxide thickness (EOT) of the gate dielectric may be minimized by omitting the interfacial layer.

The semiconductor device 500 may include other various features, such as gate spacers may be formed on both sides of gate structure formed by a deposition and etching step. The gate spacers may include a suitable dielectric material such as silicon nitride, silicon oxide, silicon carbide, silicon oxynitride, or combinations thereof. Additionally, source and drain regions may be formed in the substrate 102 using ion implantation or diffusion. It is understood that although the methods and devices discussed above are directed at a transistor, other types of devices implementing high-k dielectric films, such as capacitors, resistors, and diodes, may be fabricated with various aspects of the present disclosure.

Thus, the present disclosure provide a method of fabricating a semiconductor device. The method includes providing a semiconductor substrate, forming a dielectric layer on the semiconductor substrate, treating the dielectric layer with a carbon containing group, forming a conductive layer on the dielectric layer, and patterning and etching the dielectric layer and conductive layer to form a gate structure. In some embodiments, the step of forming the dielectric layer includes configuring the dielectric layer to include a dielectric constant (k) greater than or equal to about 3.9. In other embodiments, the step of forming the dielectric layer includes configuring the dielectric layer to include a type selected from a group consisting of: $HfO_2$, $SrTiO_3$, $ZrO_2$, HfSiO, $TiO_2$, and $Ta_2O_5$. In other embodiments, forming the conductive layer includes configuring the conductive layer to include a polysilicon or metal. In still other embodiments, the step of treating the dielectric layer includes configuring the carbon containing group to include a $OCH_3$ group. In some embodiments, the $OCH_3$ group comprises R—$OCH_3$, wherein R equals $C_xH_y$, wherein x,y equals an integer.

In other embodiments, treating the dielectric layer includes configuring the carbon containing group to include a CN group. In some embodiments, the CN group comprises a KCN or HCN solution. In still other embodiments, the method further includes the step of treating the semiconductor substrate with a carbon containing group before forming the dielectric layer.

Additionally, the present disclosure also provides another embodiment of a method including providing a semiconductor substrate; forming a high-k dielectric layer over the semiconductor substrate; treating the high-k dielectric layer with a carbon containing group; forming a conductive layer over the treated high-k dielectric layer; and patterning and etching the conductive and high-k dielectric layer as part of forming a semiconductor device. In some embodiments, the step of treating the high-k dielectric layer includes immersing the high-k dielectric layer in a $OCH_3$ containing solution. In some other embodiments, the step of treating the high-k dielectric layer includes immersing the high-k dielectric layer in a CN containing solution. In other embodiments, the method further includes treating the semiconductor substrate with a carbon containing group.

The present disclosure also provides another embodiment of a method of fabricating a semiconductor device. The method includes providing a semiconductor substrate, forming a dielectric layer over the semiconductor substrate, treating the dielectric layer with a supercritical fluid containing a $OCH_3$ or CN group. In some embodiments, the supercritical fluid is of a type selected from a group consisting of: $N_2$, Ar, Xe, $CO_2$, propane, ammonial, isopropanol, methanol, and water. In some other embodiments, the dielectric layer has a dielectric constant greater than or equal to about 3.9. In still some other embodiments, the conductive layer is of a type selected from a group consisting of a polysilicon and a metal. In other embodiments, the $OCH_3$ group comprises R—$OCH_3$, wherein R equals $C_xH_y$, wherein x,y equals an integer. In other embodiments, the CN group includes a KCN or HCN solution. In still other embodiments, the step of treating the dielectric layer includes treating the semiconductor substrate at the same time.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Several advantages exist with these and other embodiment. In addition to providing a simple and cost-effective method and device for passivating gate dielectric film, the method and device disclosed herein may be implemented and integrated with current semiconductor fabrication techniques and equipment. The method and device may be utilized with a variety of devices such as transistors, capacitors, resistors, diodes, and combinations thereof. Additionally, the method and device disclosed herein reduces drifting of a threshold voltage while maintaining a small effective oxide thickness of the semiconductor device. The thickness of the passivated interface may almost be not measurable. The passivated interface is not a "dense layer." This allows the method and device disclosed herein to be effectively implemented even as feature sizes continue to get smaller with emerging technologies.

What is claimed is:

1. A method of making a semiconductor device, comprising:
   providing a semiconductor substrate;
   forming a dielectric layer over the semiconductor substrate;
   treating the dielectric layer with a carbon containing group;
   forming a conductive layer over the treated dielectric layer; and
   patterning and etching the dielectric and conductive layer to form a gate structure.

2. The method of claim 1, wherein forming the dielectric layer includes configuring the dielectric layer to include a dielectric constant greater than or equal to 3.9.

3. The method of claim 1, wherein forming the dielectric layer includes configuring the dielectric layer to include a type selected from a group consisting of: $HfO_2$, $SrTiO_3$, $ZrO_2$, HfSiO, $TiO_2$, and $Ta_2O_5$.

4. The method of claim 1, wherein forming the conductive layer includes configuring the conductive layer to include a polysilicon or metal.

5. The method of claim 1, wherein treating the dielectric layer includes configuring the carbon containing group to include a $OCH_3$ group.

6. The method of claim 5, wherein the $OCH_3$ group comprises R—$OCH_3$, wherein R equals $C_xH_y$, wherein x,y equals an integer.

7. The method of claim 1, wherein treating the dielectric layer includes configuring the carbon containing group to include a CN group.

8. The method of claim 7, wherein the CN group comprises a KCN or HCN solution.

9. The method of claim 1, further comprising treating the semiconductor substrate with a carbon containing group before forming the dielectric layer.

10. A method, comprising:
    providing a semiconductor substrate;
    forming a high-k dielectric layer over the semiconductor substrate;
    treating the high-k dielectric layer with a carbon containing group;
    forming a conductive layer over the treated high-k dielectric layer; and
    patterning and etching the conductive layer and high-k dielectric layer as part of forming a semiconductor device.

11. The method of claim 10, wherein treating the high-k dielectric layer includes immersing the high-k dielectric layer in a $OCH_3$ containing solution.

12. The method of claim 10, wherein treating the high-k dielectric layer includes immersing the high-k dielectric layer in a CN containing solution.

13. The method of claim 11, further comprising treating the semiconductor substrate with a carbon containing group.

14. A method, comprising:
    providing a semiconductor substrate;
    forming a dielectric layer over the semiconductor substrate;

treating the dielectric layer with a supercritical fluid containing a $OCH_3$ group or CN group;

forming a conductive layer over the treated dielectric layer; and etching the dielectric and conductive layer to form a gate structure.

15. The method of claim 14, wherein the supercritical fluid is of a type selected from a group consisting of: $N_2$, Ar, Xe, $CO_2$, propane, ammonia, isopropanol, methanol, and water.

16. The method of claim 14, wherein the dielectric layer has a dielectric constant greater than or equal to about 3.9.

17. The method of claim 14, wherein the conductive layer is of a type selected from a group consisting of a polysilicon and a metal.

18. The method of claim 14, wherein the $OCH_3$ group comprises $R-OCH_3$, wherein R equals $C_xH_y$, wherein x,y equals an integer.

19. The method of claim 14, wherein the CN group comprises a KCN or HCN solution.

20. The method of claim 14, wherein treating the dielectric layer includes treating the semiconductor substrate at the same time.

* * * * *